United States Patent
Wei

(10) Patent No.: US 11,916,016 B2
(45) Date of Patent: Feb. 27, 2024

(54) ANTI-FUSE DEVICE AND MANUFACTURING METHOD THEREOF

(71) Applicant: Winbond Electronics Corp., Taichung (TW)

(72) Inventor: Hung-Yu Wei, Taichung (TW)

(73) Assignee: Winbond Electronics Corp., Taichung (TW)

( * ) Notice: Subject to any disclaimer, the term of this patent is extended or adjusted under 35 U.S.C. 154(b) by 212 days.

(21) Appl. No.: 17/565,483

(22) Filed: Dec. 30, 2021

(65) Prior Publication Data
US 2023/0215803 A1 Jul. 6, 2023

(51) Int. Cl.
*H01L 23/525* (2006.01)
(52) U.S. Cl.
CPC .................. *H01L 23/5252* (2013.01)
(58) Field of Classification Search
CPC .................................................. H01L 23/5252
USPC ........................................................ 257/530
See application file for complete search history.

(56) References Cited

U.S. PATENT DOCUMENTS

| 8,035,191 | B2 | 10/2011 | Lin et al. |
| 8,729,642 | B2 | 5/2014 | Kitamura et al. |
| 10,224,278 | B2 * | 3/2019 | Yamamoto ............. H10B 20/20 |
| 10,720,389 | B2 | 7/2020 | Chang et al. |
| 2020/0020705 | A1 * | 1/2020 | Huang ................ H01L 23/5252 |

FOREIGN PATENT DOCUMENTS

| KR | 101145383 | 5/2012 |
| TW | I652793 | 3/2019 |

* cited by examiner

*Primary Examiner* — Ajay Arora
(74) *Attorney, Agent, or Firm* — JCIPRNET

(57) ABSTRACT

An anti-fuse device including a substrate, a doped region, a dielectric layer, a first contact, an anti-fuse material layer, and a second contact is provided. The doped region is located in the substrate. The dielectric layer is located on the substrate and has a first opening and a second opening. The first opening and the second opening respectively expose the doped region. The first contact is located in the first opening. The anti-fuse material layer is located between the first contact and the doped region. The second contact is located in the second opening and is electrically connected to the doped region.

20 Claims, 17 Drawing Sheets

ANTI-FUSE DEVICE AND MANUFACTURING METHOD THEREOF

BACKGROUND

Field of the Disclosure

The embodiment of the disclosure relates to a semiconductor device and a manufacturing method thereof, and in particular, to an anti-fuse device and a manufacturing method thereof.

Description of Related Art

Nowadays, an anti-fuse device has been developed, which has an anti-fuse material layer. In the initial state, the anti-fuse material layer has a high resistance, and the anti-fuse device is in an open state. When the anti-fuse device is subjected to operation, the anti-fuse material layer will break down to form a conductive path, and the anti-fuse device is in a short-circuit state. Currently, common anti-fuse devices are operated through gates. However, due to the large contact area between the gate and the anti-fuse material layer, there is high uncertainty of the position where the anti-fuse material layer generates breakdown. As a result, after the anti-fuse material layer breaks down, the resistance of the anti-fuse device has a high uncertainty, and misjudgment of data is likely to occur.

SUMMARY

The disclosure provides an anti-fuse device and a manufacturing method thereof, which can prevent misjudgement of data.

The disclosure provides an anti-fuse device including a substrate, a doped region, a dielectric layer, a first contact, an anti-fuse material layer, and a second contact. The doped region is located in the substrate. The dielectric layer is located on the substrate and has a first opening and a second opening. The first opening and the second opening respectively expose the doped region. The first contact is located in the first opening. The anti-fuse material layer is located between the first contact and the doped region. The second contact is located in the second opening and is electrically connected to the doped region.

The disclosure provides a method for manufacturing an anti-fuse device, which includes the following steps. A substrate is provided. A doped region is formed in the substrate. A dielectric layer is formed on the substrate. A first opening is formed in the dielectric layer. The first opening exposes the doped region. An anti-fuse material layer is formed in the first opening. A first contact is formed in the first opening. The first contact is located on the anti-fuse material layer. A second opening is formed in the dielectric layer. The second opening exposes the doped region. A second contact is formed in the second opening. The second contact is electrically connected to the doped region.

Based on the above, in the anti-fuse device and the manufacturing method thereof provided in the disclosure, since the first contact is formed in the first opening, the contact area between the first contact and the anti-fuse material layer can be reduced by controlling the size of the first opening. Therefore, when the anti-fuse device is undergone operation, the breakdown of the anti-fuse material layer can be converged and concentrated in a small range, thereby reducing the uncertainty of the resistance of the anti-fuse device to prevent misjudgement of data. Moreover, since the anti-fuse device is operated by applying voltage to the first contact and the second contact, the anti-fuse device may not have a gate, so that the anti-fuse device can have a small device area, and thus improving density of device.

In order to make the above-mentioned features and advantages of the present disclosure more comprehensible, the following specific embodiments are described in detail in conjunction with the accompanying drawings.

DETAILED DESCRIPTION OF DISCLOSED EMBODIMENTS

Figure 1A:
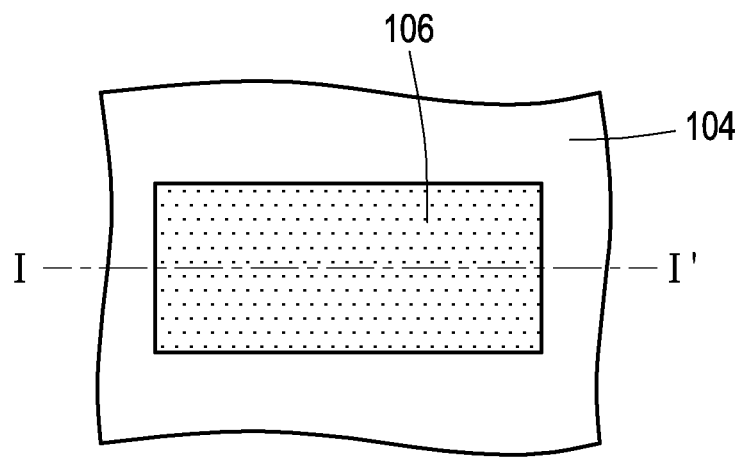
FIG. 1A to FIG. 1I are top views of a manufacturing process of an anti-fuse device according to an embodiment of the disclosure.

FIG. 1A to FIG. 1I are top views of a manufacturing process of an anti-fuse device according to an embodiment of the disclosure. FIG. 2A to FIG. 2I are cross-sectional views taken along the cross-sectional line I-I' in FIG. 1A to FIG. 1I. Referring to FIG. 1A and FIG. 2A, a substrate 100 is provided. The substrate 100 may be a semiconductor substrate, such as a silicon substrate. In addition, a well region 102 may be formed in the substrate 100. The method of forming the well region 102 is, for example, an ion implantation method. Additionally, an isolation structure 104 may be formed in the substrate 100. The isolation structure 104 is, for example, a shallow trench isolation structure. The material of the isolation structure 104 is, for example, an oxide (e.g., silicon oxide). Next, a doped region 106 is formed in the substrate 100. The isolation structure 104 may encircle the doped region 106 (see FIG. 1A). In some embodiments, the doped region 106 may be formed in the well region 102. The method of forming the doped region 106 is, for example, an ion implantation method. The doped region 106 and the well region 102 may have different conductivity types. For example, the doped region 106 and the well region 102 may be one and the other of the N-type conductivity type and the P-type conductivity type, respectively.

Figure 1B:
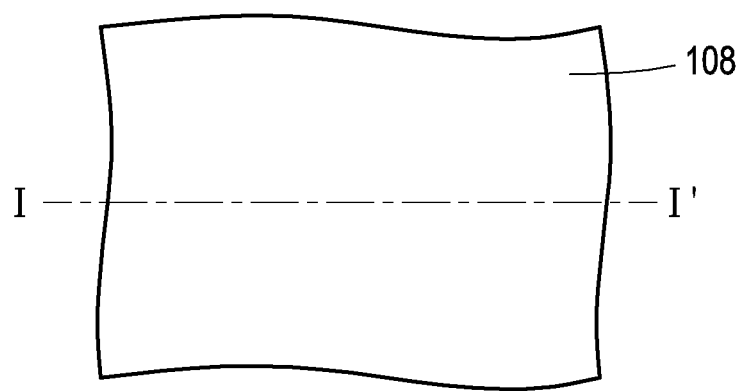
Figure 2A:
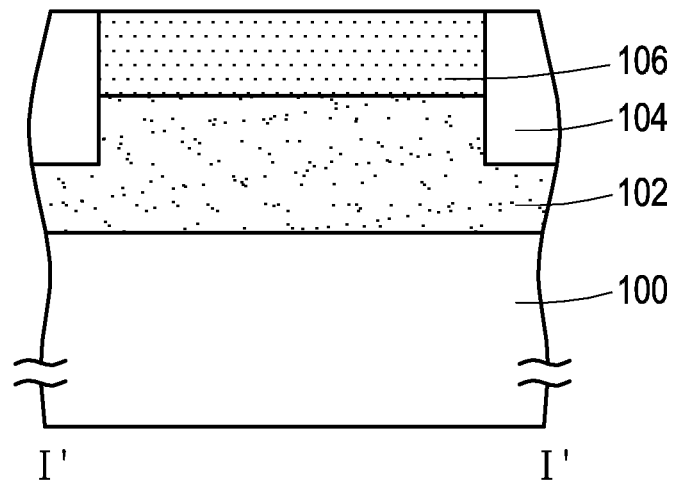
FIG. 2A to FIG. 2I are cross-sectional views taken along the cross-sectional line I-I' in FIG. 1A to FIG. 1I.
Figure 2B:
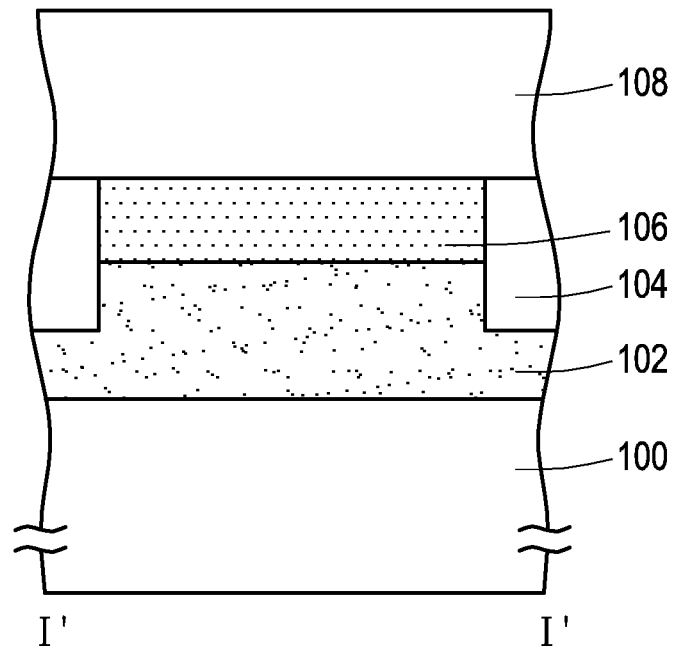

Referring to FIG. 1B and FIG. 2B, a dielectric layer 108 is formed on the substrate 100. The material of the dielectric layer 108 is, for example, an oxide (e.g., silicon oxide). The method of forming the dielectric layer 108 is, for example, a chemical vapor deposition method. In some embodiments, a chemical mechanical polishing process may be performed on the dielectric layer 108 to planarize the surface of the dielectric layer 108.

Figure 1C:
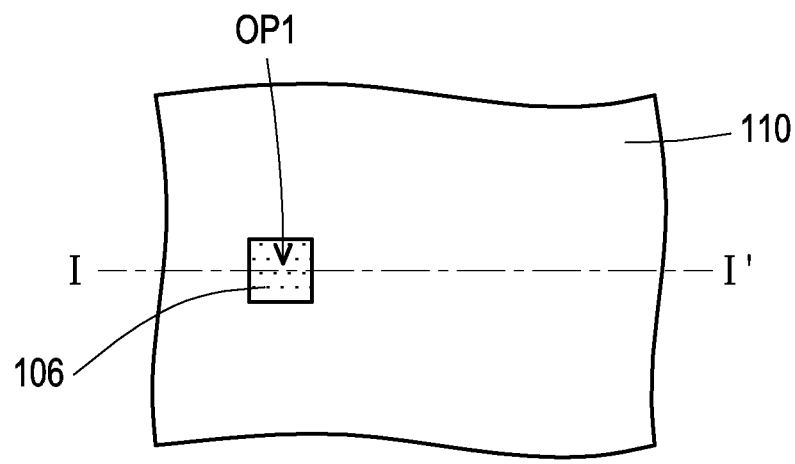
Figure 2C:
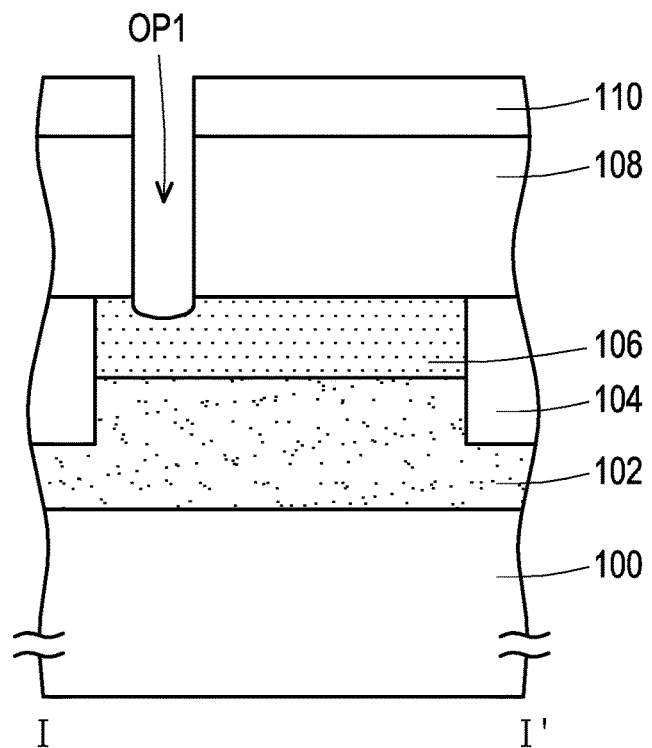

Referring to FIG. 1C and FIG. 2C, a patterned hard mask layer 110 may be formed on the dielectric layer 108. The patterned hard mask layer 110 may expose a portion of the dielectric layer 108. The material of the patterned hard mask layer 110 is, for example, a nitride (e.g., silicon nitride). The patterned hard mask layer 110 can be formed by a deposition process, a lithography process, and an etching process.

Then, a portion of the dielectric layer 108 exposed by the patterned hard mask layer 110 can be removed by using the patterned hard mask layer 110 as a mask. Thereby, an opening OP1 can be formed in the dielectric layer 108. The opening OP1 exposes the doped region 106. In this embodiment, an over etching process may be performed to remove part of the doped region 106, so that the cross-sectional shape of the bottom of the opening OP1 becomes an arc (see FIG. 2C). In other embodiments, the etching process may not be performed, and the cross-sectional shape of the bottom of the opening OP1 may be flat. The method for removing the part of the dielectric layer 108 exposed by the patterned hard mask layer 110 is, for example, a dry etching method.

Figure 1D:
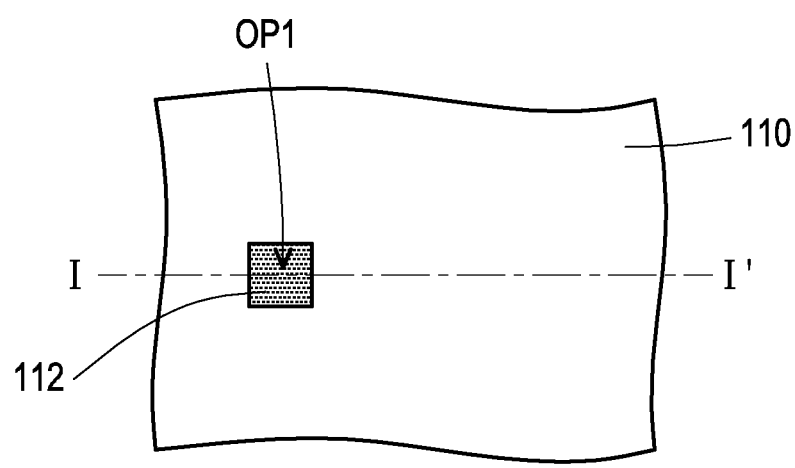
Figure 2D:
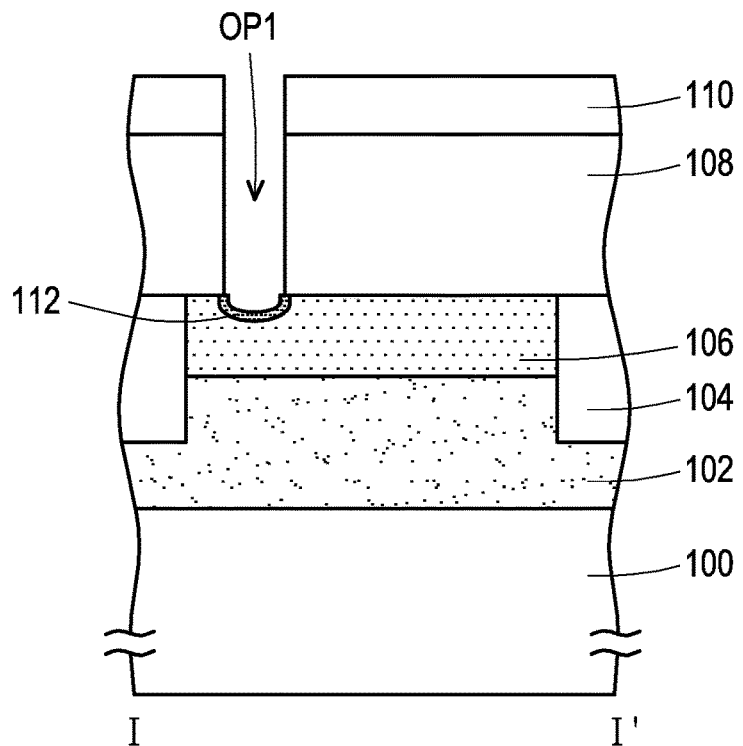

Referring to FIG. 1D and FIG. 2D, an anti-fuse material layer 112 is formed in the opening OP1. The anti-fuse material layer 112 may be directly formed on the doped region 106. The material of the anti-fuse material layer 112 is, for example, an oxide (e.g., silicon oxide). The method for forming the anti-fuse material layer 112 is, for example, a thermal oxidation method or a plasma oxidation method.

Figure 1E:
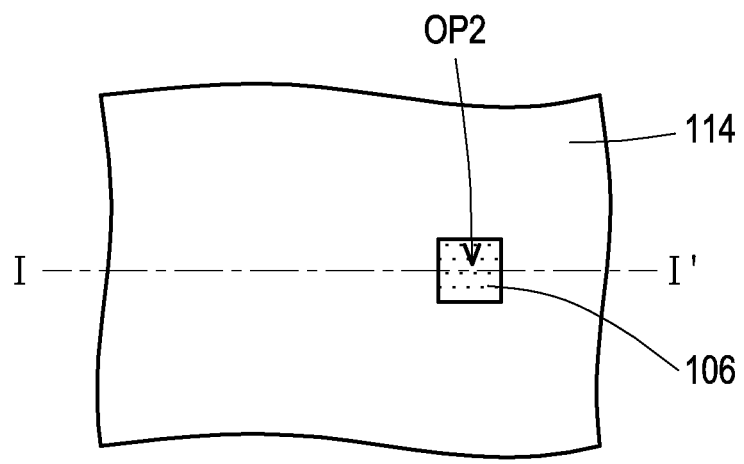
Figure 2E:
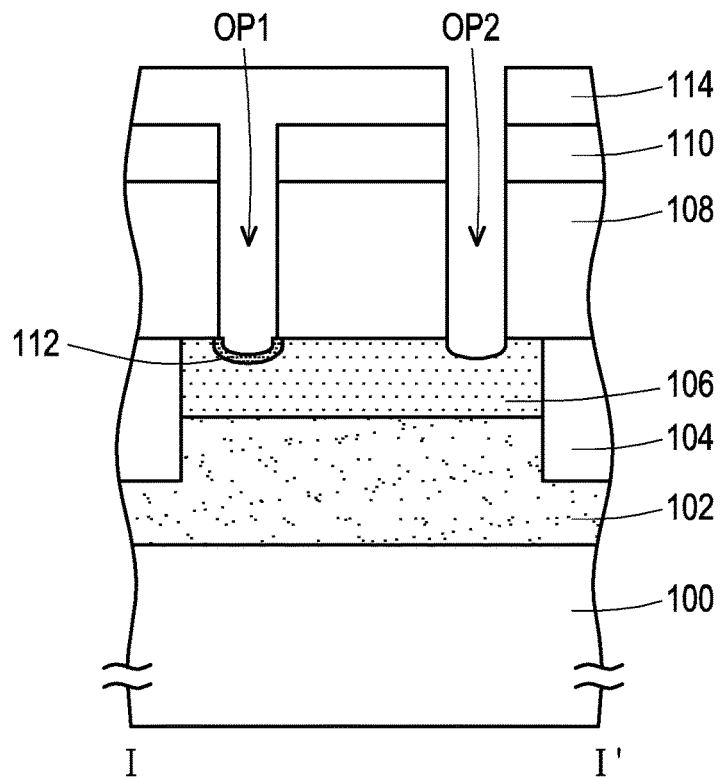

Referring to FIG. 1E and FIG. 2E, a patterned hard mask layer 114 may be formed on the patterned hard mask layer 110. The patterned hard mask layer 114 can be filled in the opening OP1. The material of the patterned hard mask layer 114 is, for example, a nitride (e.g., silicon nitride). The patterned hard mask layer 114 can be formed by a deposition process, a lithography process, and an etching process. In some embodiments, a portion of the patterned hard mask layer 110 exposed by the patterned hard mask layer 114 may be removed, so as to expose a portion of the dielectric layer 108. Then, the patterned hard mask layer 114 and the patterned hard mask layer 110 can be used as a mask to remove part of the dielectric layer 108 exposed by the patterned hard mask layer 114 and the patterned hard mask layer 110. Thereby, an opening OP2 can be formed in the dielectric layer 108. The opening OP2 exposes the doped region 106. In this embodiment, an over-etching process may be performed to remove part of the doped region 106, so that the cross-sectional shape of the bottom of the opening OP2 becomes an arc (see FIG. 2E). In other embodiments, the over-etching process may not be performed, and the bottom of the opening OP2 may be flat. The method for removing the part of the dielectric layer 108 exposed by the patterned hard mask layer 114 and the patterned hard mask layer 110 is, for example, a dry etching method.

Figure 1F:
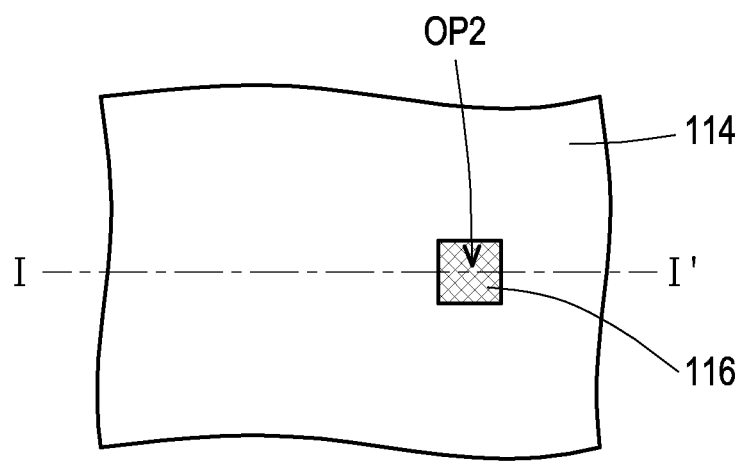
Figure 2F:
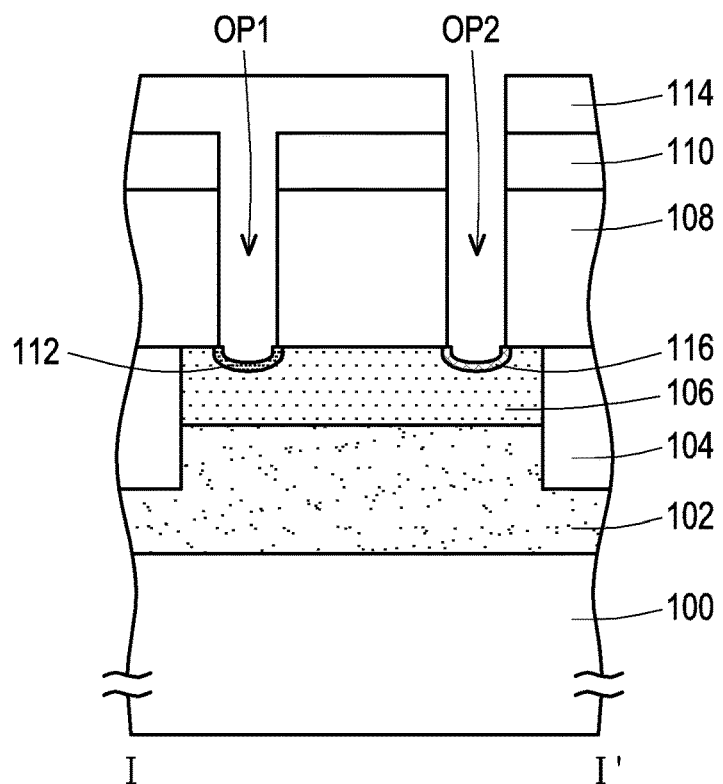

Referring to FIG. 1F and FIG. 2F, a metal silicide layer 116 may be directly formed on the doped region 106 exposed by the opening OP2. The material of the metal silicide layer 116 is, for example, cobalt silicide (CoSi) or nickel silicide (NiSi). The method for forming the metal silicide layer 116 is, for example, a self-aligned metal silicide process.

Figure 1G:
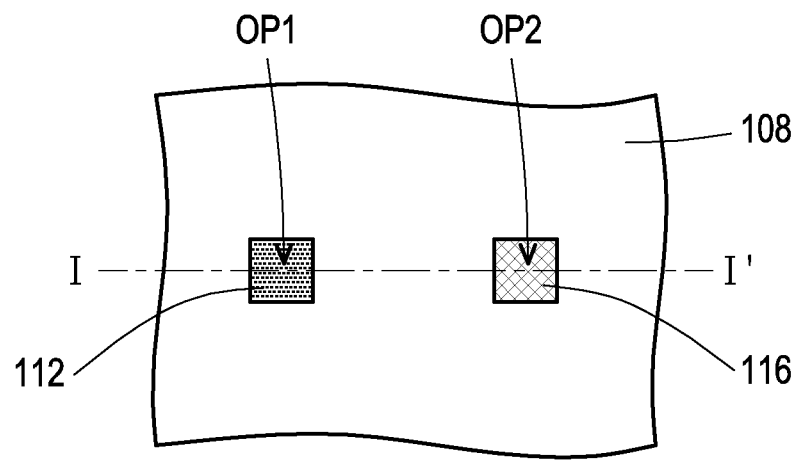
Figure 2G:
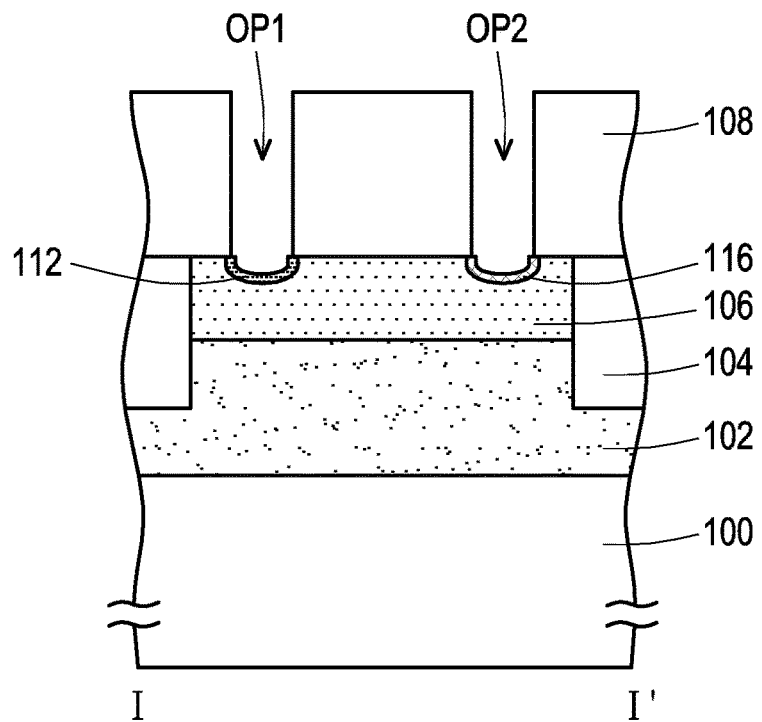

Referring to FIG. 1G and FIG. 2G, the patterned hard mask layer 114 and the patterned hard mask layer 110 can be removed. The method of removing the patterned hard mask layer 114 and the patterned hard mask layer 110 is, for example, a wet etching method.

Figure 1H:
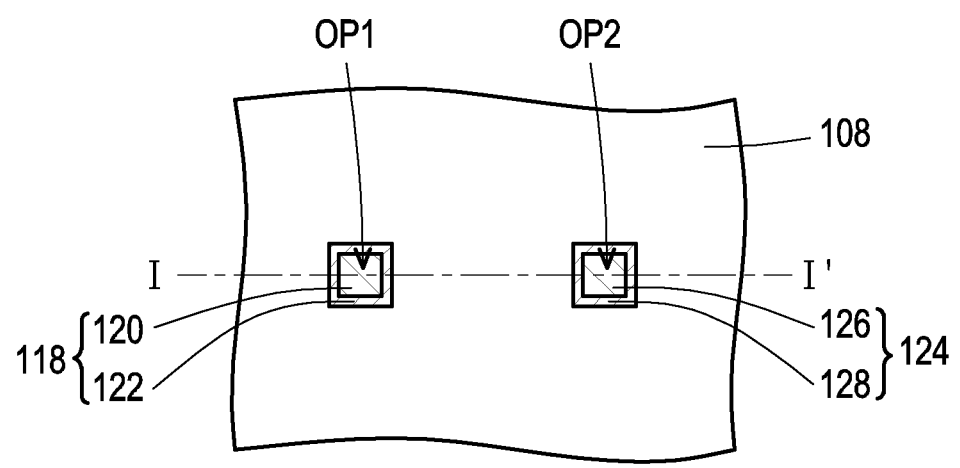
Figure 2H:
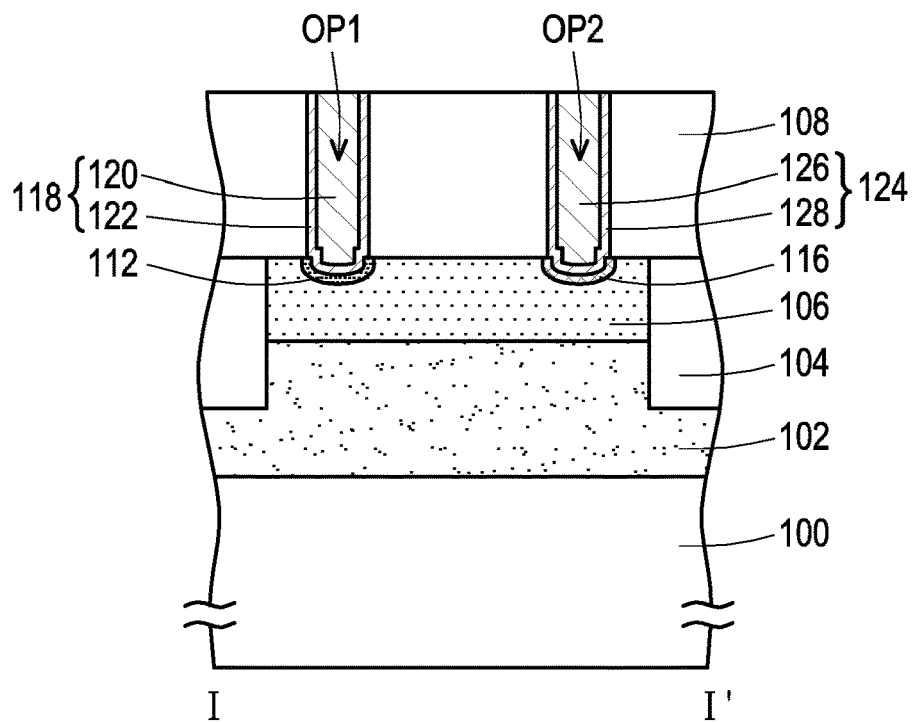

Referring to FIG. 1H and FIG. 2H, a contact 118 is formed in the opening OP1. The contact 118 is located on the anti-fuse material layer 112. The contact 118 can directly contact the anti-fuse material layer 112. In this embodiment, since the cross-sectional shape of the bottom of the opening OP1 is an arc shape, the cross-sectional shape of the interface between the contact 118 and the anti-fuse material layer 112 may be an arc shape. In other embodiments, when the cross-sectional shape of the bottom of the opening OP1 is flat, the cross-sectional shape of the interface between the contact 118 and the anti-fuse material layer 112 may be flat. The contact 118 can be a single-layer structure or a multi-layer structure. In this embodiment, the contact 118 is exemplified as a multi-layer structure including a conductor layer 120 and a barrier layer 122. The conductor layer 120 is located in the opening OP1. The material of the conductor layer 120 is, for example, tungsten or aluminum. The barrier layer 122 is located between the conductor layer 120 and the anti-fuse material layer 112 and between the conductor layer 120 and the dielectric layer 108. The material of the barrier layer 122 is, for example, titanium, titanium nitride, or a combination thereof.

In addition, a contact 124 is formed in the opening OP2. The contact 124 may be formed on the metal silicide layer 116. The contact 124 can directly contact the metal silicide layer 116. The contact 124 is electrically connected to the doped region 106. In this embodiment, the contact 124 can be electrically connected to the doped region 106 through the metal silicide layer 116. The contact 118 can be a single-layer structure or a multi-layer structure. In this embodiment, the contact 124 is exemplified as a multi-layer structure including a conductor layer 126 and a barrier layer 128. The conductor layer 126 is located in the opening OP2. The material of the conductor layer 126 is, for example, tungsten. The barrier layer 128 is located between the conductor layer 126 and the metal silicide layer 116 and between the conductor layer 126 and the dielectric layer 108. The material of the barrier layer 128 is, for example, titanium, titanium nitride, or a combination thereof.

In this embodiment, the contact 118 and the contact 124 can be formed simultaneously by the same process. In some embodiments, the method for forming the contact 118 and the contact 124 is performed by, for example, first forming a contact material layer (not shown) filled in the opening OP1 and the opening OP2, and then removing the contact material layer located outside the opening OP1 and the opening OP2 by a chemical mechanical polishing method.

Figure 1I:
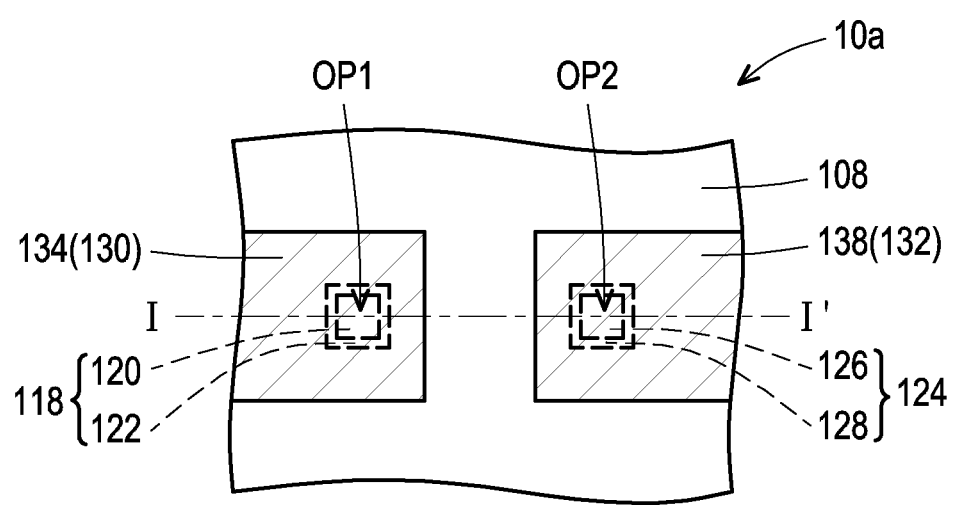
Figure 2I:
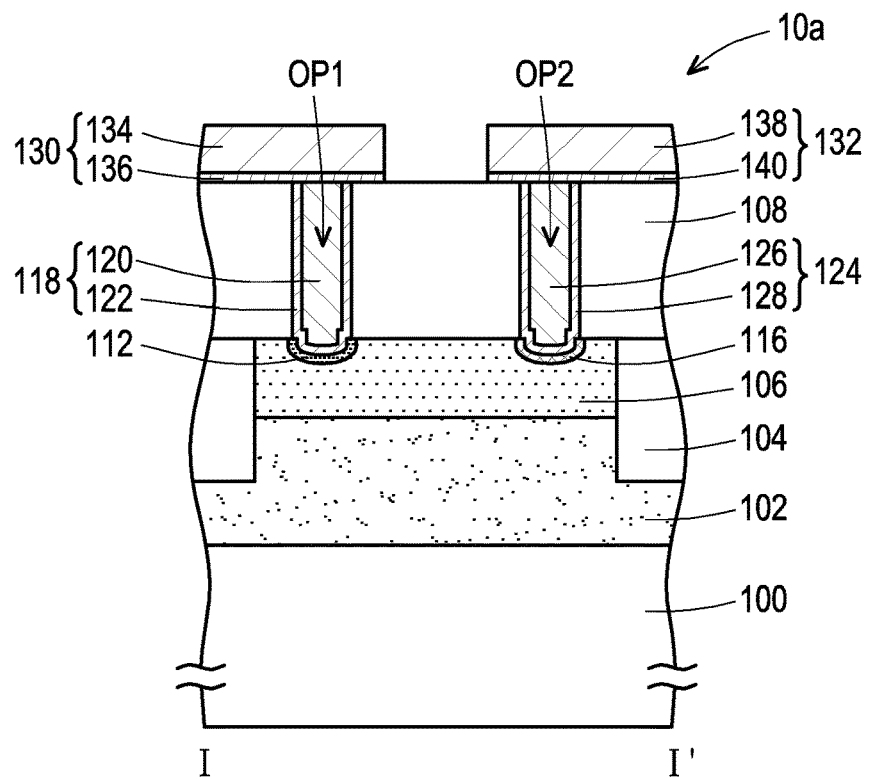

Referring to FIG. 1I and FIG. 2I, a wire 130 and a wire 132 may be formed on the dielectric layer 108. The wire 130 and the wire 132 are electrically connected to the contact 118 and the contact 124 respectively. The wire 130 and the wire 132 may be a single-layer structure or a multi-layer structure. In this embodiment, the wire 130 and the wire 132 are exemplified as a multi-layer structure. For example, the wire 130 may include a conductor layer 134 and a barrier layer 136, and the wire 132 may include a conductor layer 138 and a barrier layer 140. The conductor layer 134 is located on the dielectric layer 108 and the contact 118. The barrier layer 136 is located between the conductor layer 134 and the dielectric layer 108 and between the conductor layer 134 and the contact 118. The conductor layer 138 is located on the dielectric layer 108 and the contact 124. The barrier layer 140 is located between the conductor layer 138 and the dielectric layer 108 and between the conductor layer 138 and the contact 124. The material of the conductor layer 134 and the conductor layer 138 is, for example, tungsten or aluminum. The material of the barrier layer 136 and the barrier layer 140 is, for example, titanium, titanium nitride, or a combination thereof. The wire 130 and the wire 132 can be formed by a deposition process, a lithography process, and an etching process.

Hereinafter, the anti-fuse device 10a of this embodiment will be described with reference to FIG. 1I and FIG. 2I. In addition, although the method for forming the anti-fuse device 10a is described using the above method as an example, the disclosure is not limited thereto.

Referring to FIG. 1I and FIG. 2I, the anti-fuse device 10a includes a substrate 100, a doped region 106, a dielectric layer 108, a contact 118, an anti-fuse material layer 112, and a contact 124. In this embodiment, the anti-fuse device 10a can be applied to one time programmable (OTP) memory. The doped region 106 is located in the substrate 100. The dielectric layer 108 is located on the substrate 100 and has an opening OP1 and an opening OP2. The opening OP1 and the opening OP2 expose the doped region 106 respectively. The contact 118 is located in the opening OP1. The anti-fuse material layer 112 is located between the contact 118 and the doped region 106. The anti-fuse material layer 112 may be directly located on the doped region 106. The contact 124 is located in the opening OP2 and is electrically connected to the doped region 106. The vertical projection of the contact 118 and the vertical projection of the contact 124 can be both located on the doped region 106. In addition, the anti-fuse device 10a may further include at least one of the well region 102, the isolation structure 104, the metal silicide layer 116, the wire 130 and the wire 132. The well region 102 is located in the substrate 100. The doped region 106 may be located in the well region 102. The doped region 106 and the well region 102 may have different conductivity types. The isolation structure 104 is located in the substrate 100 and encircles the doped region 106 (see FIG. 1A). The metal silicide layer 116 is located between the contact 124 and the doped region 106. The metal silicide layer 116 can be directly located on the doped region 106. The wire 130 and the wire 132 are electrically connected to the contact 118 and the contact 124 respectively.

Based on the above embodiment, in the anti-fuse device 10a and the manufacturing method thereof, since the contact 118 is formed in the opening OP1, the contact area between the contact 118 and the anti-fuse material layer 112 can be reduced by controlling the size of the opening OP1. Therefore, when the anti-fuse device 10a is undergone operation, the breakdown of the anti-fuse material layer 112 can be converged and concentrated in a small range, thereby reducing the uncertainty of the resistance of the anti-fuse device 10a to prevent misjudgment of data. Additionally, since the anti-fuse device 10a is undergone operation by applying voltage to the contact 118 and the contact 124, the anti-fuse device 10a may not have a gate, so that the anti-fuse device 10a can have a small device area, thereby increasing the density of device. In some embodiments, when the cross-sectional shape of the interface between the contact 118 and the anti-fuse material layer 112 is arc-shaped, the electric field can be more concentrated, thereby making the breakdown of the anti-fuse material layer 112 more convergent and concentrated.

Figure 3:
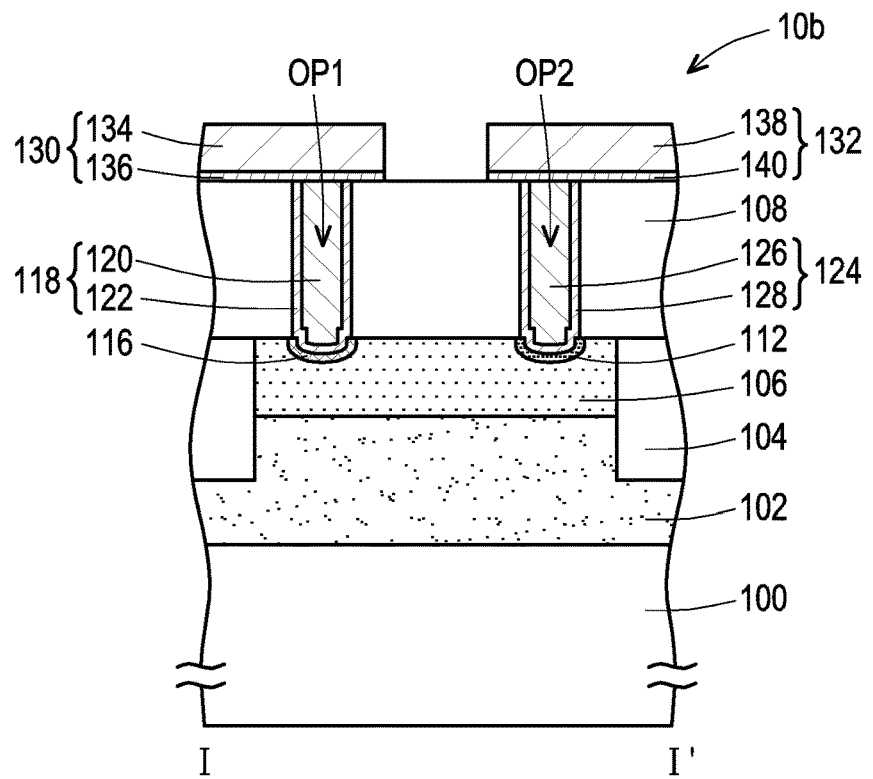
FIG. 3 is a cross-sectional view of an anti-fuse device according to another embodiment of the disclosure.

FIG. 3 is a cross-sectional view of an anti-fuse device according to another embodiment of the disclosure. Referring to FIG. 2I and FIG. 3, the difference between the anti-fuse device 10b in FIG. 3 and the anti-fuse device 10a in FIG. 2I is described as follows. In the embodiment of FIG. 2A to FIG. 2I, the opening OP1 and the anti-fuse material layer 112 are formed first, and then the opening OP2 and the metal silicide layer 116 are formed. In the embodiment of FIG. 3, the opening OP1 and the metal silicide layer 116 are formed first, and then the opening OP2 and the anti-fuse material layer 112 are formed. In addition, the same components in the anti-fuse device 10b of FIG. 3 and the anti-fuse device 10a of FIG. 2I are denoted by the same symbols, and the description thereof will be omitted.

FIG. 4A to FIG. 4E are top views of a manufacturing process of an anti-fuse device according to another embodiment of the disclosure. FIG. 4A to FIG. 4E are cross-sectional views of the manufacturing process following the steps in FIG. 1D. FIG. 5A to FIG. 5E are cross-sectional views taken along the cross-sectional line II-II' in FIG. 4A to FIG. 4E. FIG. 5A to FIG. 5E are cross-sectional views of the manufacturing process following the steps in FIG. 2D.

Please refer to FIG. 1D, FIG. 2D, FIG. 4A and FIG. 5A, after forming the anti-fuse material layer 112 (see FIG. 1D and FIG. 2D), the patterned hard mask layer 110 (see FIG. 1D and FIG. 2D) can be removed. The method for removing the patterned hard mask layer 110 is, for example, a wet etching method. Next, a contact 202 is formed in the opening OP1. The contact 202 is located on the anti-fuse material layer 112. The contact 202 can directly contact the anti-fuse material layer 112. In this embodiment, the contact 202 may include a conductor layer 204 and a barrier layer 206. Additionally, for the detailed description of the contact 202, reference may be made to the description of the contact 118 (see FIG. 2H) in the foregoing embodiment, and no further description is incorporated herein.

Figure 4A:
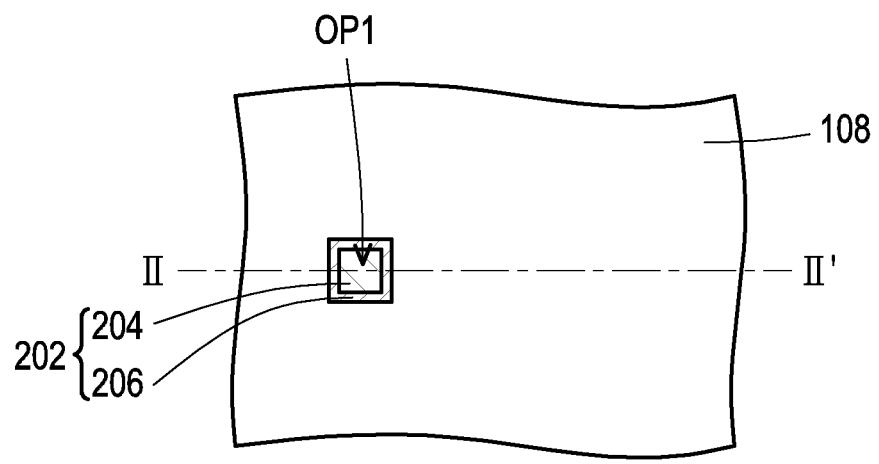
FIG. 4A to FIG. 4E are top views of a manufacturing process of an anti-fuse device according to another embodiment of the disclosure.
Figure 4B:
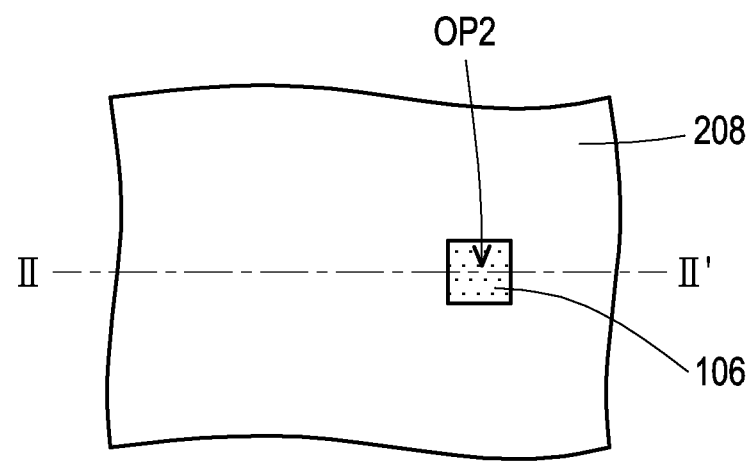
Figure 5A:
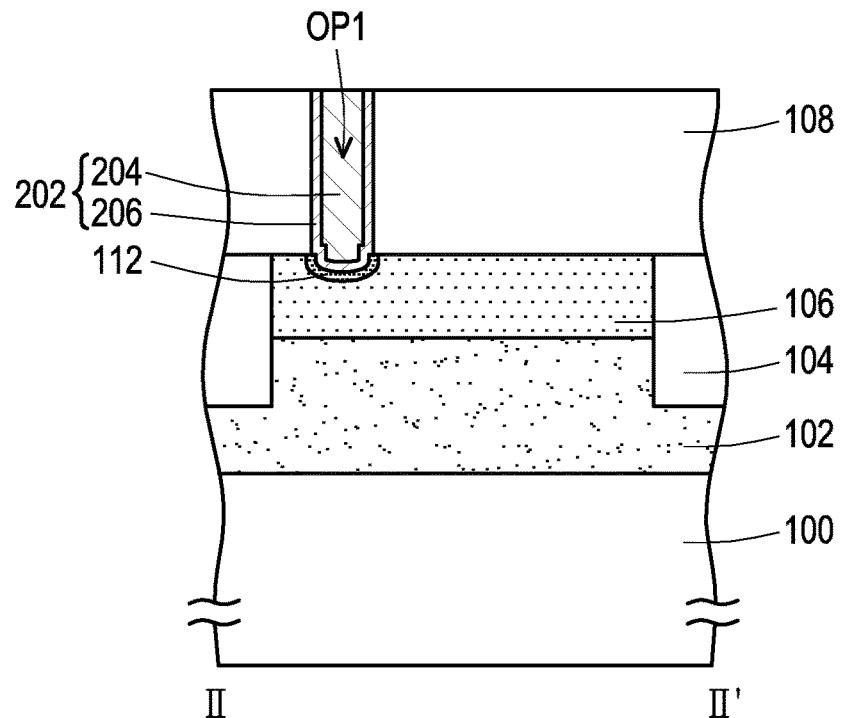
FIG. 5A to FIG. 5E are cross-sectional views taken along the cross-sectional line II-II' in FIG. 4A to FIG. 4E.
Figure 5B:
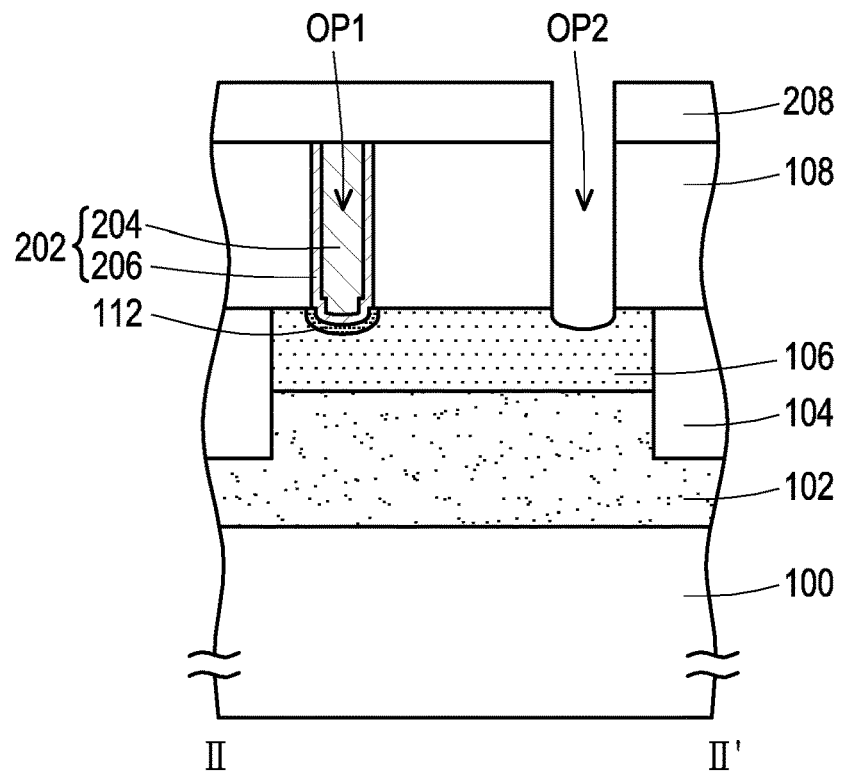

Referring to FIG. 4B and FIG. 5B, a patterned hard mask layer 208 may be formed on the dielectric layer 108. The patterned hard mask layer 208 may expose a portion of the dielectric layer 108. The material of the patterned hard mask layer 208 is, for example, a nitride (e.g., silicon nitride). The patterned hard mask layer 208 can be formed by a deposition process, a lithography process, and an etching process.

Then, a portion of the dielectric layer 108 exposed by the patterned hard mask layer 208 can be removed by using the patterned hard mask layer 208 as a mask. Thereby, an opening OP2 can be formed in the dielectric layer 108. The opening OP2 exposes the doped region 106. The method for removing the part of the dielectric layer 108 exposed by the patterned hard mask layer 208 is, for example, a dry etching method.

Figure 4C:
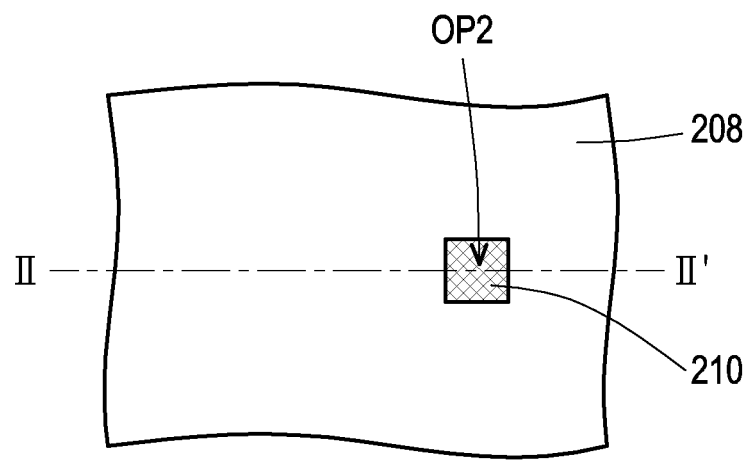
Figure 5C:
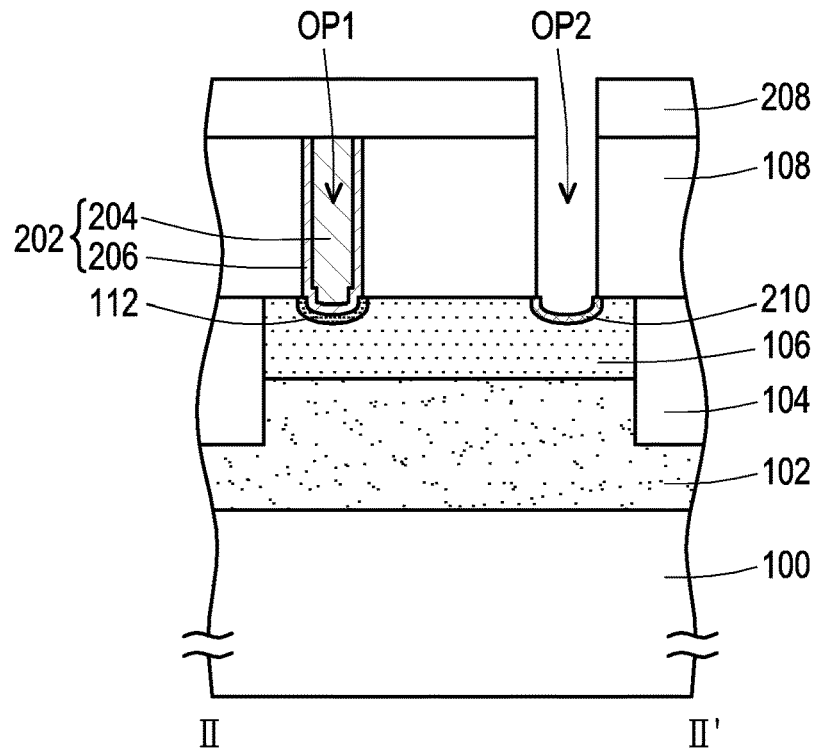

Referring to FIG. 4C and FIG. 5C, a metal silicide layer 210 may be directly formed on the doped region 106 exposed by the opening OP2. The material of the metal silicide layer 210 is, for example, cobalt silicide or nickel silicide. The method for forming the metal silicide layer 210 is, for example, a self-aligned metal silicide process.

Figure 4D:
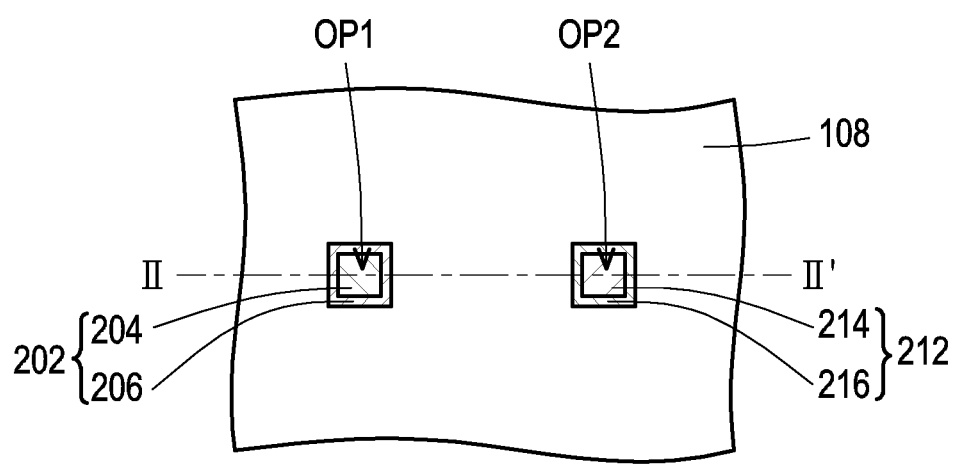
Figure 5D:
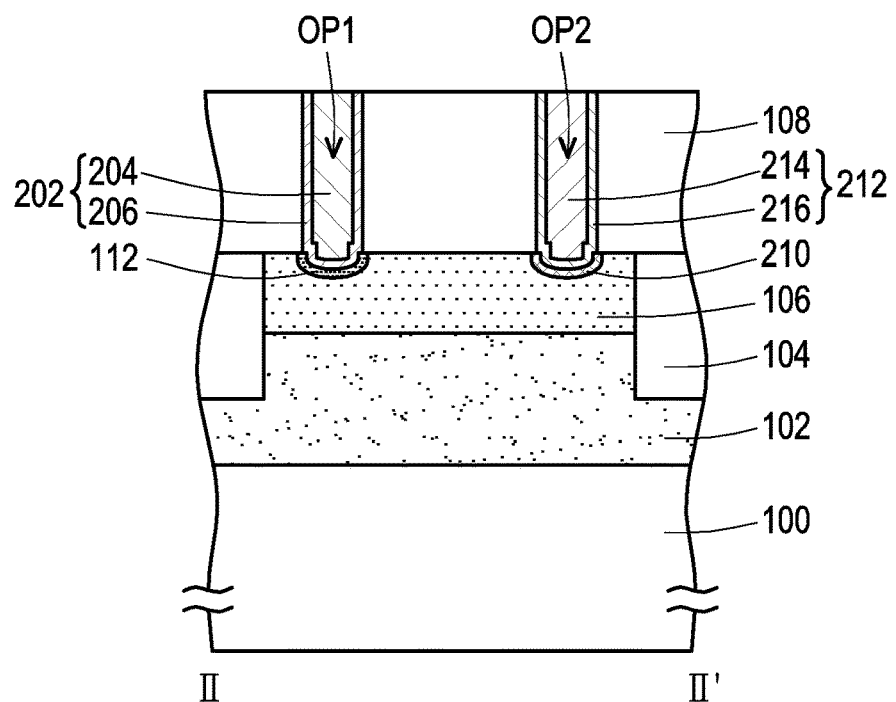

Referring to FIG. 4D and FIG. 5D, the patterned hard mask layer 208 can be removed. The method of removing the patterned hard mask layer 208 is, for example, a wet etching method.

Next, a contact 212 is formed in the opening OP2. In this embodiment, the contact 202 and the contact 212 are formed by different processes. The contact 212 may be formed on the metal silicide layer 210. The contact 212 can directly contact the metal silicide layer 210. The contact 212 is electrically connected to the doped region 106. In this embodiment, the contact 212 can be electrically connected to the doped region 106 through the metal silicide layer 210. In this embodiment, the contact 212 may include a conductor layer 214 and a barrier layer 216. In addition, for the details of the contact 212, reference may be made to the description of the contact 124 (see FIG. 2H) in the above embodiment, and no further description is incorporated herein.

Figure 4E:
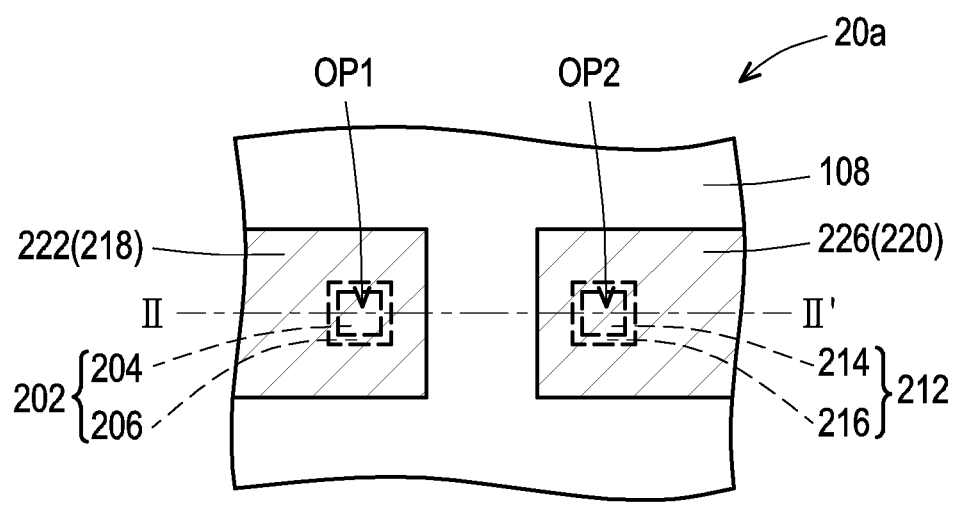
Figure 5E:
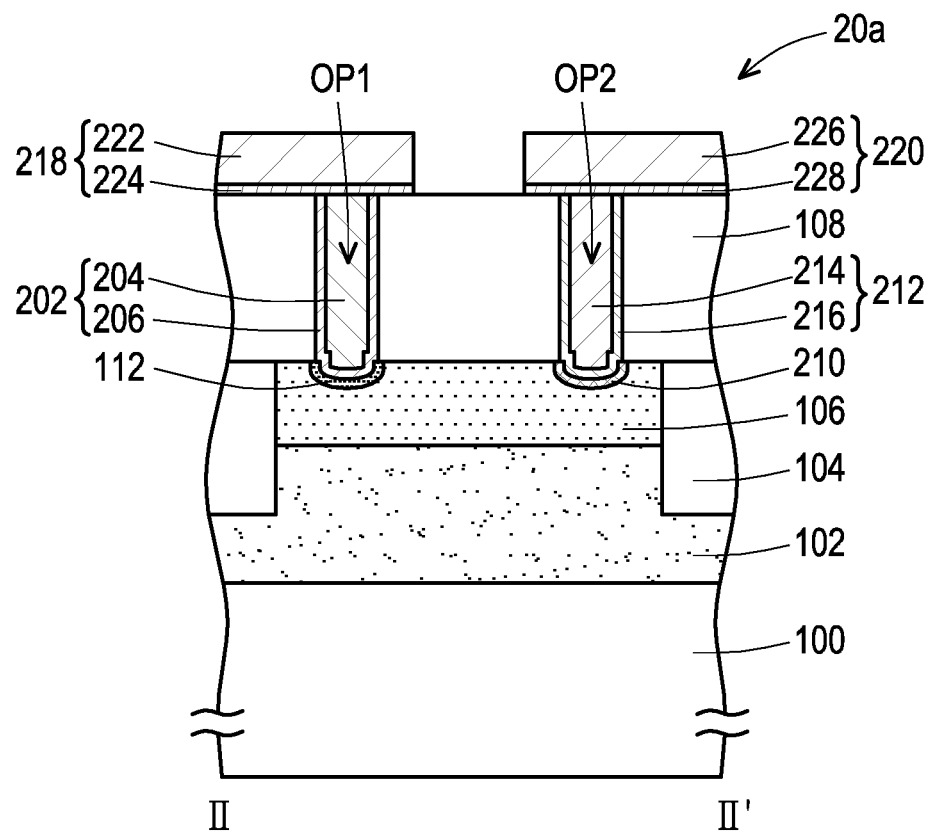

Referring to FIG. 4E and FIG. 5E, a wire 218 and a wire 220 may be formed on the dielectric layer 108. The wire 218 and the wire 220 are electrically connected to the contact 202 and the contact 212, respectively. In this embodiment, the wire 218 may include a conductor layer 222 and a barrier layer 224, and the wire 220 may include a conductor layer 226 and a barrier layer 228. Moreover, for the detailed description of the wire 218 and the wire 220, please refer to the description of the wire 130 and the wire 132 (see FIG. 2I) in the foregoing embodiment, and no further description is incorporated herein.

Figure 6:
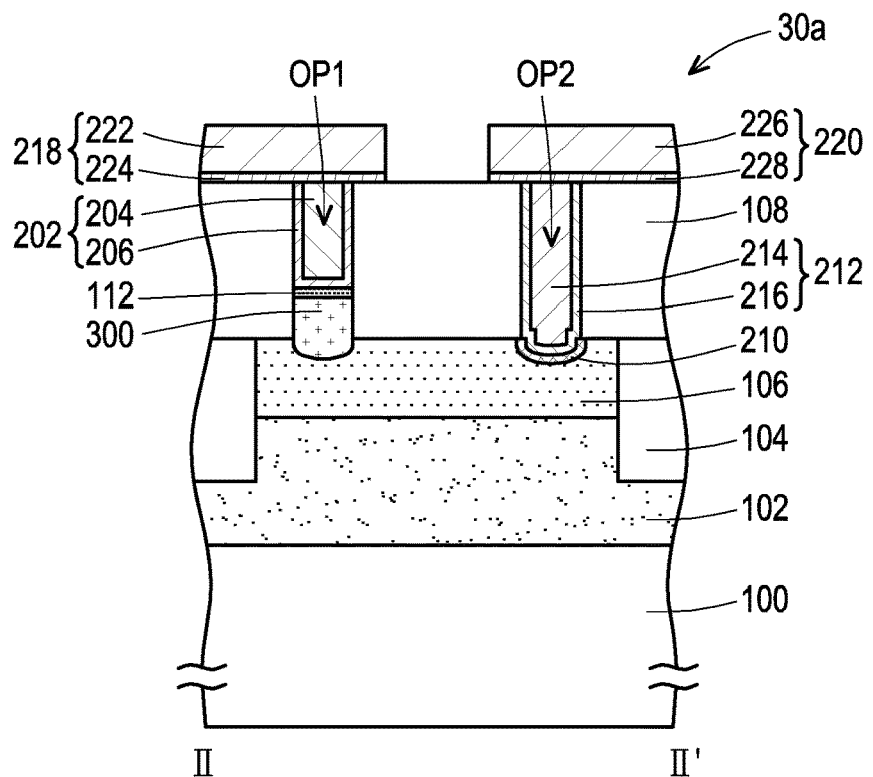
FIG. 6 and FIG. 7 are cross-sectional views of anti-fuse devices according to other embodiments of the disclosure.

FIG. 6 is a cross-sectional view of an anti-fuse device according to another embodiment of the disclosure. Referring to FIG. 5E and FIG. 6, the difference between the anti-fuse device 30a of FIG. 6 and the anti-fuse device 20a of FIG. 5E is explained as follows. In FIG. 6, the anti-fuse device 30a may further include a contact 300. The contact 300 is located between the anti-fuse material layer 112 and the doped region 106. The anti-fuse material layer 112 can be directly located on the contact 300. In addition, the manufacturing method of the anti-fuse device 30a may further include the following steps. Before forming the anti-fuse material layer 112, a contact 300 may be formed in the opening OP1. The material of the contact 300 is, for example, a silicon-containing material such as doped polysilicon. In the condition that the material of contact 300 is a silicon-containing material such as doped polysilicon, since the resistance of the silicon-containing material is higher than that of metal, the operating current of the anti-fuse device 30a is smaller. Therefore, under the same bias voltage, the power loss of the anti-fuse device 30a is reduced. The method of forming the contact 300 is performed by, for example, forming a contact material layer (not shown) in the opening OP1, and then performing an etching back process on the contact material layer. The anti-fuse material layer 112 can be directly formed on the contact 300. In this embodiment, the cross-sectional shape of the interface between the contact 202 and the anti-fuse material layer 112 may be flat. In addition, the height of the contact 300 can be higher or lower than the height of the contact 202 according to requirements of process. In this embodiment, the height of the contact 300 may be lower than the height of the contact 202. In addition, the same components in the anti-fuse device 30a of FIG. 6 and the anti-fuse device 20a of FIG. 5E are denoted by the same symbols, and the description thereof will be omitted.

Figure 7:
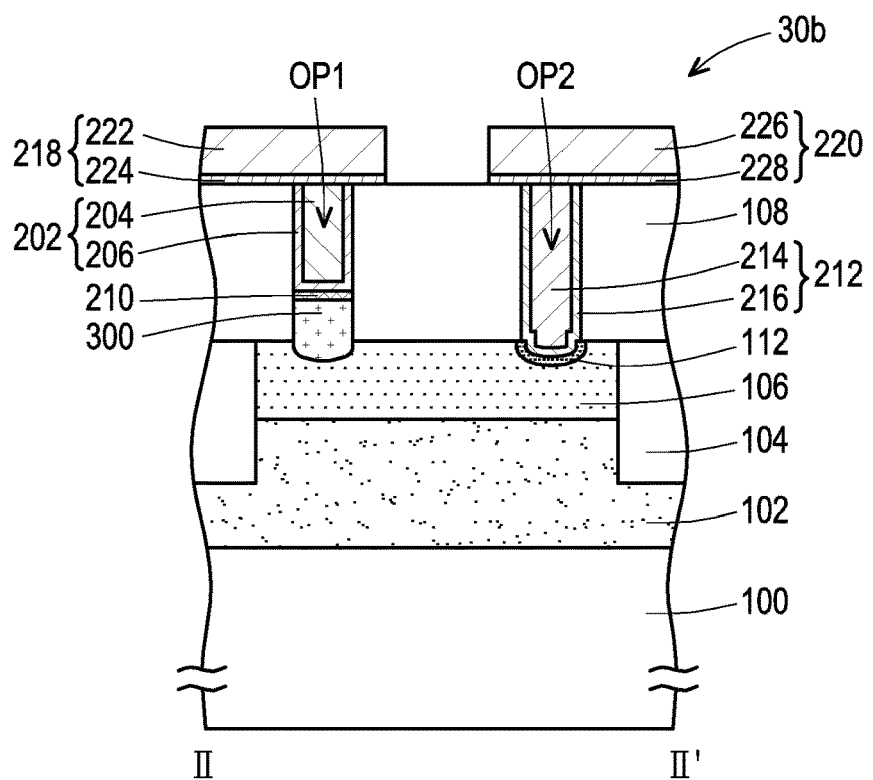

FIG. 7 is a cross-sectional view of an anti-fuse device according to another embodiment of the disclosure. Referring to FIG. 6 and FIG. 7, the difference between the anti-fuse device 30b in FIG. 7 and the anti-fuse device 30a in FIG. 6 is described as follows. In the embodiment of FIG. 6, the opening OP1 and the anti-fuse material layer 112 are formed first, and then the opening OP2 and the metal silicide layer 210 are formed. In the embodiment of FIG. 7, the opening OP1 and the metal silicide layer 210 are formed first, and then the opening OP2 and the anti-fuse material layer 112 are formed. In the anti-fuse device 30b, the metal silicide layer 210 is located between the contact 202 and the contact 300. The metal silicide layer 210 can be directly located on the contact 300. In addition, during the manufacturing process of the anti-fuse device 30b, the metal silicide layer 210 is directly formed on the contact 300. The contact 202 can be formed on the metal silicide layer 210. In addition, the same components in the anti-fuse device 30b of FIG. 7 and the anti-fuse device 30a of FIG. 6 are denoted by the same symbols, and the description thereof will be omitted.

In summary, in the anti-fuse device and the manufacturing method thereof described in the above-mentioned embodiment, the contact area between the contact and the anti-fuse material layer can be reduced by controlling the size of the opening, so that the uncertainty of the resistance of the anti-fuse device can be reduced, thereby preventing misjudgment of data. In addition, the anti-fuse device can have a small device area, which in turn can increase density of device.

Although the disclosure has been disclosed as above by way of embodiments, it is not intended to limit the disclosure. Any person with ordinary knowledge in the technical field can make some changes and decorations without departing from the spirit and scope of the disclosure, so the protection scope of the disclosure shall be determined by the scope of the attached claims.

What is claimed is:

1. An anti-fuse device, comprising:
   a substrate;
   a doped region, located in the substrate;
   a dielectric layer, located on the substrate and having a first opening and a second opening, wherein the first opening and the second opening respectively expose the doped region;
   a first contact, located in the first opening;
   an anti-fuse material layer, located between the first contact and the doped region; and
   a second contact, located in the second opening and electrically connected to the doped region.

2. The anti-fuse device according to claim 1, wherein the first contact directly contacts the anti-fuse material layer.

3. The anti-fuse device according to claim 1, wherein a cross-sectional shape of an interface between the first contact and the anti-fuse material layer comprises an arc shape.

4. The anti-fuse device according to claim 1, wherein a material of the anti-fuse material layer comprises an oxide.

5. The anti-fuse device according to claim 1, further comprising:
   a metal silicide layer, located between the second contact and the doped region, wherein the metal silicide layer is directly located on the doped region.

6. The anti-fuse device according to claim 1, further comprising:
   a third contact, located between the anti-fuse material layer and the doped region, wherein a material of the third contact comprises a silicon-containing material.

7. The anti-fuse device according to claim 1, wherein a vertical projection of the first contact and a vertical projection of the second contact are both located on the doped region.

8. The anti-fuse device according to claim 1, further comprising:
   a third contact, located between the second contact and the doped region; and
   a metal silicide layer, located between the second contact and the third contact, wherein the metal silicide layer is directly located on the third contact.

9. The anti-fuse device according to claim 1, further comprising:
   an isolation structure, located in the substrate and encircling the doped region; and
   a well region, located in the substrate, wherein the doped region is located in the well region, and the doped region and the well region have different conductivity types.

10. The anti-fuse device according to claim 1, wherein the anti-fuse material layer is directly located on the doped region.

11. A manufacturing method of an anti-fuse device, comprising:
    providing a substrate;
    forming a doped region in the substrate;
    forming a dielectric layer on the substrate;

forming a first opening in the dielectric layer, wherein the first opening exposes the doped region;

forming an anti-fuse material layer in the first opening;

forming a first contact in the first opening, wherein the first contact is located on the anti-fuse material layer;

forming a second opening in the dielectric layer, wherein the second opening exposes the doped region; and forming a second contact in the second opening, wherein the second contact is electrically connected to the doped region.

12. The manufacturing method of the anti-fuse device according to claim 11, wherein the first opening and the anti-fuse material layer are formed first, and then the second opening is formed.

13. The manufacturing method of the anti-fuse device according to claim 11, wherein the second opening is formed first, and then the first opening and the anti-fuse material layer are formed.

14. The manufacturing method of the anti-fuse device according to claim 11, wherein a method for forming the anti-fuse material layer comprises a thermal oxidation method or a plasma oxidation method.

15. The manufacturing method of the anti-fuse device according to claim 11, wherein the first contact and the second contact are simultaneously formed by the same manufacturing process.

16. The manufacturing method of the anti-fuse device according to claim 11, wherein the first contact and the second contact are respectively formed by different processes.

17. The manufacturing method of the anti-fuse device according to claim 11, wherein the anti-fuse material layer is directly formed on the doped region.

18. The manufacturing method of the anti-fuse device according to claim 11, further comprising:

before forming the anti-fuse material layer, forming a third contact in the first opening.

19. The manufacturing method of the anti-fuse device according to claim 11, further comprising:

before forming the second contact, forming a metal silicide layer on the doped region exposed by the second opening, wherein the second contact is formed on the metal silicide layer.

20. The manufacturing method of the anti-fuse device according to claim 11, further comprising:

before forming the second contact, forming a third contact in the second opening; and forming a metal silicide layer on the third contact, wherein the second contact is formed on the metal silicide layer.

* * * * *